United States Patent [19]

Kato et al.

[11] Patent Number: 4,994,880

[45] Date of Patent: Feb. 19, 1991

[54] SEMICONDUCTOR DEVICE CONSTITUTING BIPOLAR TRANSISTOR

[75] Inventors: Naohito Kato, Chiryu; Yoshiyuki Miyase, Okazaki; Tomoatsu Makino, Okazaki; Kasuhiro Yamada, Oobu; Masami Yamaoka, Anjo; Takeshi Matsui, Toyohashi; Masahiro Yamamoto, Gamagori; Yoshiki Ishida, Kariya; Tohru Nomura, Oobu; all of Japan

[73] Assignee: Nippondenso Co., Ltd., Kariya, Japan

[21] Appl. No.: 412,552

[22] Filed: Sep. 25, 1989

Related U.S. Application Data

[63] Continuation of Ser. No. 114,287, Oct. 29, 1987, abandoned.

[30] Foreign Application Priority Data

Oct. 31, 1986 [JP] Japan .................. 61-260994
Dec. 4, 1986 [JP] Japan .................. 61-289424

[51] Int. Cl.$^5$ ............... H01L 29/72; H01L 27/02; H01L 29/90
[52] U.S. Cl. ............................. 357/34; 357/13; 357/36; 357/46
[58] Field of Search ............... 357/46, 36, 34, 13

[56] References Cited

U.S. PATENT DOCUMENTS

| | | | |
|---|---|---|---|
| 3,596,150 | 7/1971 | Berthold et al. | 357/46 |
| 3,836,996 | 9/1974 | Schilp et al. | 357/46 |
| 4,167,748 | 9/1979 | D'Angelo et al. | 357/46 |
| 4,293,868 | 10/1981 | Iizuka et al. | 357/13 |
| 4,652,902 | 3/1987 | Takata et al. | 357/46 |

FOREIGN PATENT DOCUMENTS

| | | |
|---|---|---|
| 0098209 | 1/1984 | European Pat. Off. |
| 1514880 | 2/1972 | Fed. Rep. of Germany . |
| 2147447 | 9/1977 | Fed. Rep. of Germany . |
| 53-124985 | 10/1978 | Japan . |
| 56-50562 | 5/1981 | Japan . |
| 57-162462 | 10/1982 | Japan .................. 357/46 |
| 58-145152 | 8/1983 | Japan .................. 357/46 |
| 59-00074 | 1/1984 | Japan . |
| 60-22366 | 2/1985 | Japan . |
| 61-159762 | 7/1986 | Japan . |
| 1211959 | 6/1969 | United Kingdom . |

OTHER PUBLICATIONS

P. P. Wang, "Power Transistor with Reverse-Biased Second Breakdown Capability", IBM Technical Disclosure Bulletin, vol. 19, No. 2, Jul. 1976, pp. 551–552.

H. W. Mittenentzei, "Konstruktion und Eigenschaften Hochsperrender Si-(Leistungsschalttransistoren", Radio Fernsehen Elektronik, vol. 34, No. 9, Sep. 1985, pp. 560–563.

*Primary Examiner*—Andrew J. James
*Assistant Examiner*—Ngan Van Ngo
*Attorney, Agent, or Firm*—Cushman, Darby & Cushman

[57] ABSTRACT

Base regions of first and second stage transistors are formed in a semiconductor substrate consisting of low and high resistivity collector layers, and emitter regions are formed in the respective base regions. The emitter region of the second stage transistor has an interdigital structure with a plurality of finger portions, and an emitter surface electrode is formed on the emitter region of the second stage transistor. The second stage transistor emitter surface electrode has an extending portion at a position spaced apart from a transistor operation region where the finger portions are formed. An emitter connection electrode is formed on the extending portion, and a lead is connected by soldering or the like to the emitter connection electrode. In a portion of the emitter surface electrode extending from the emitter connection electrode to the transistor operation region, slits are formed such that they are bypassed by emitter current so that the lead resistance from each finger portion to the emitter connection electrode is substantially uniform.

14 Claims, 10 Drawing Sheets

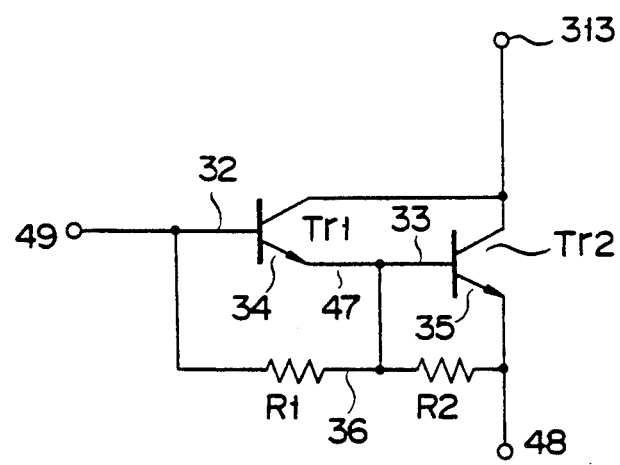
F I G. 2
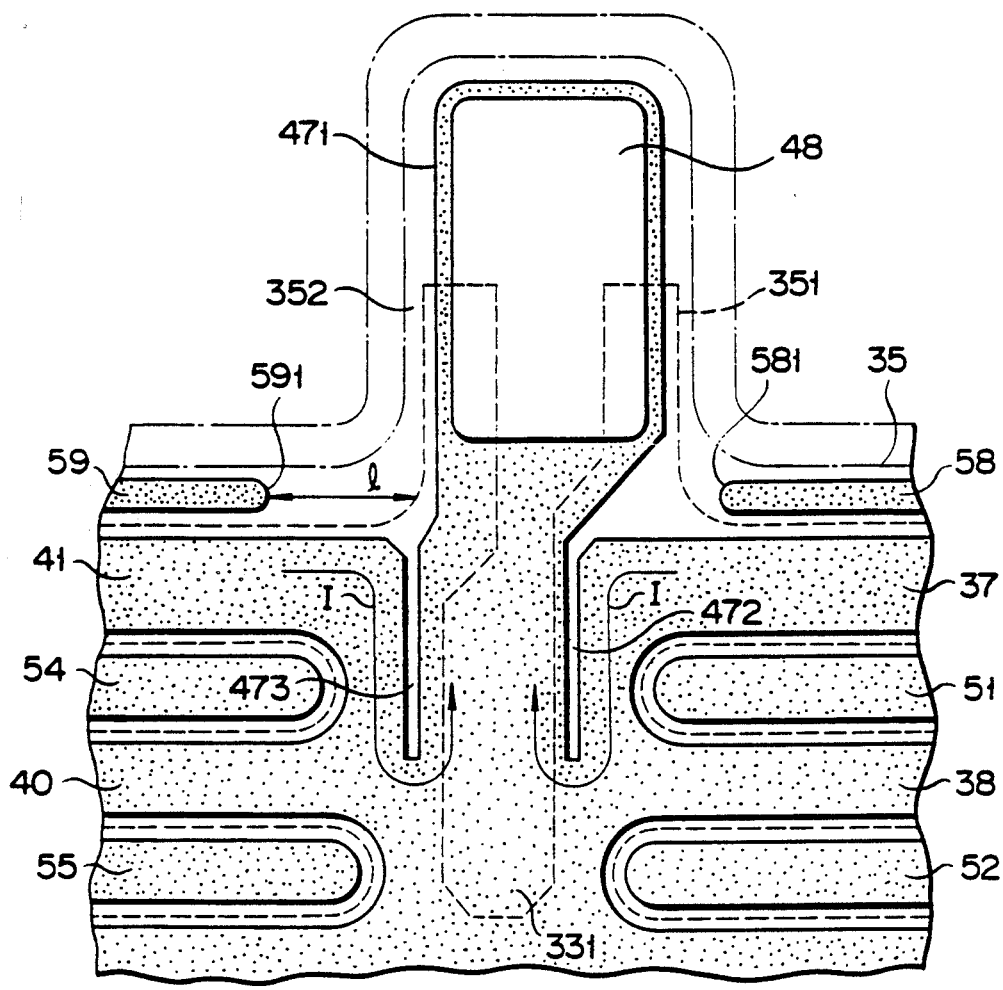
F I G. 3

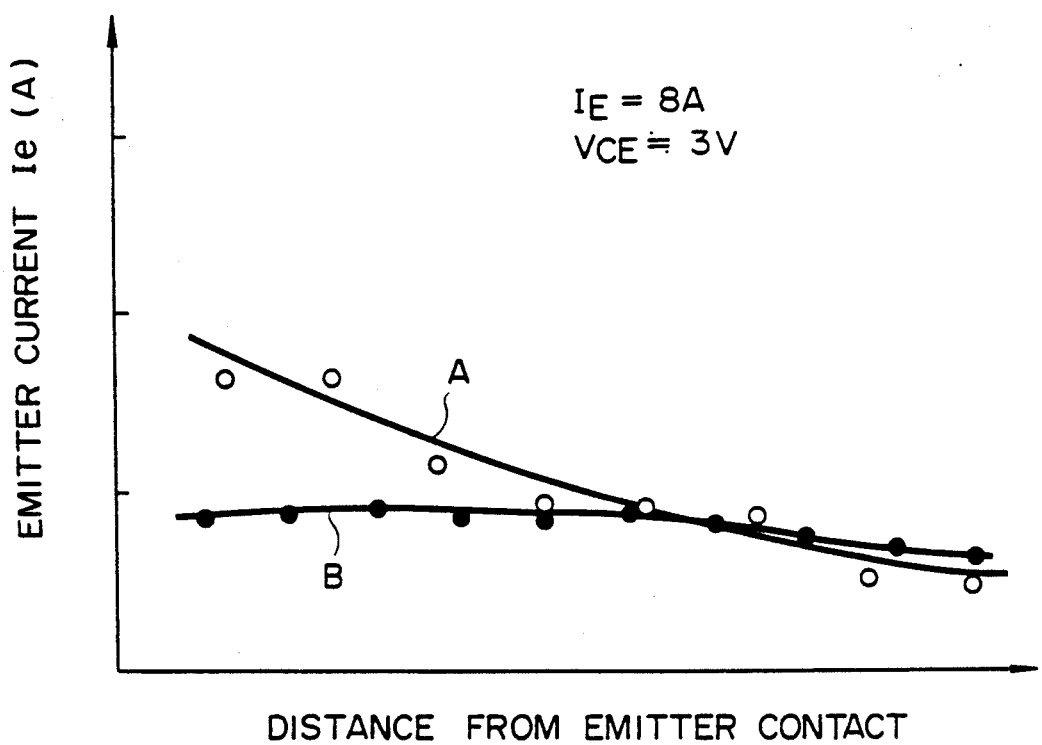
F I G. 4
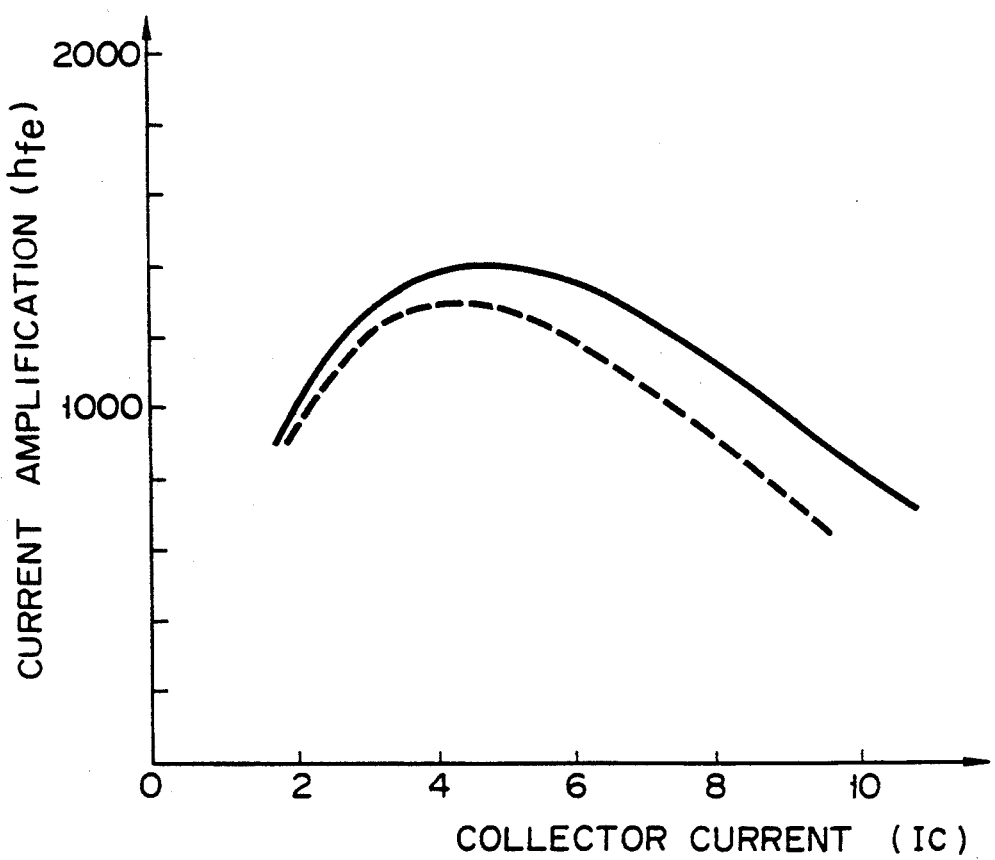
F I G. 5

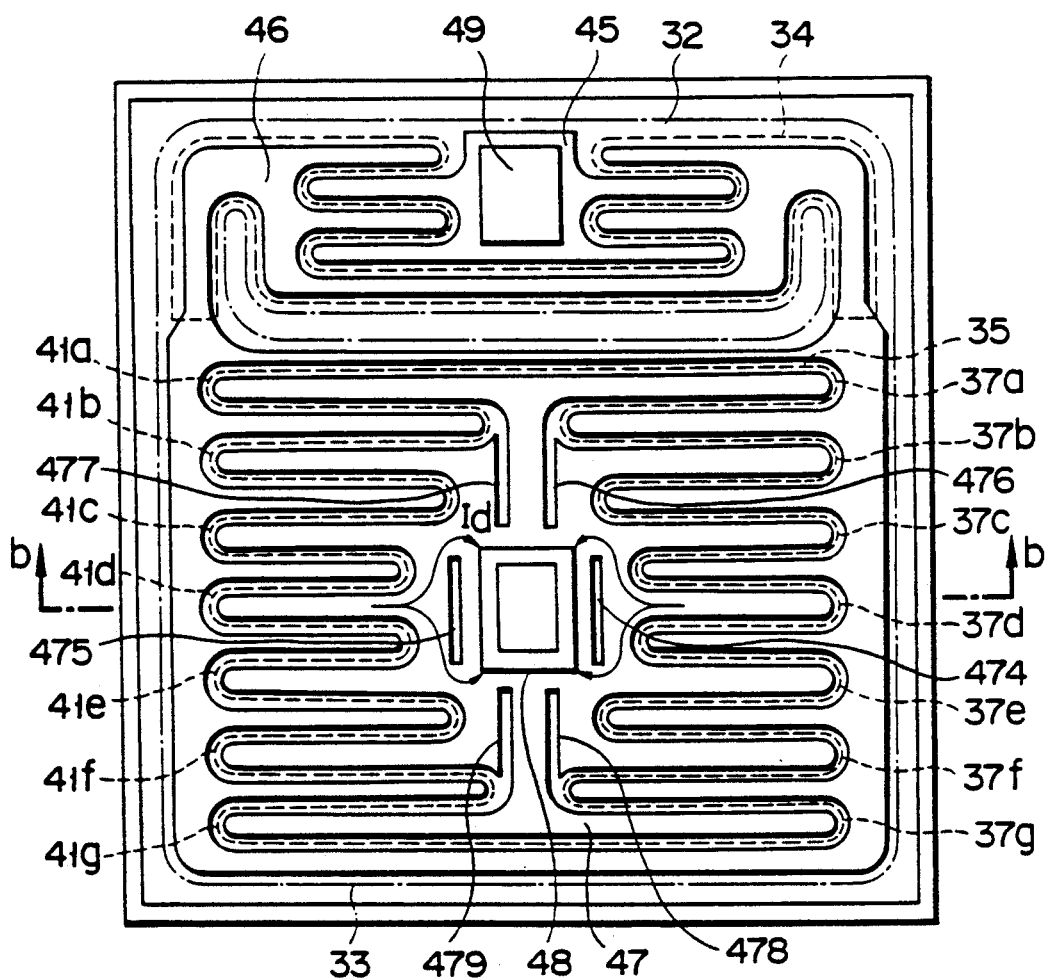
F I G. 6A
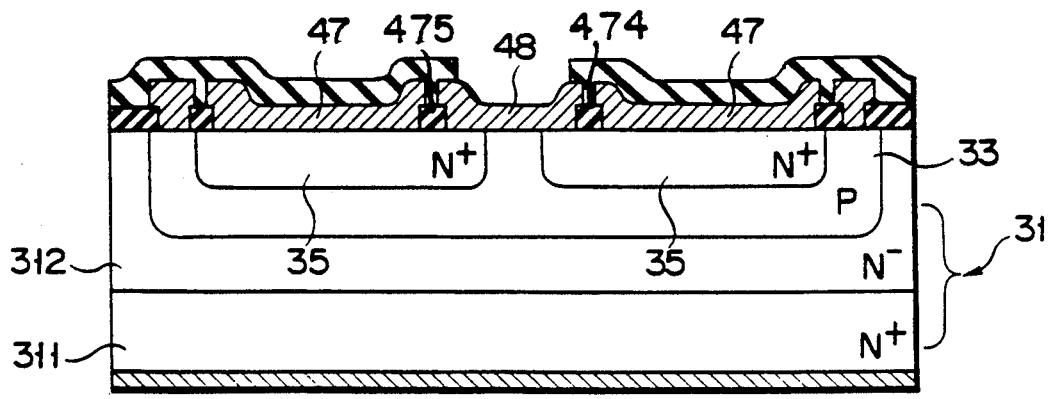
F I G. 6B

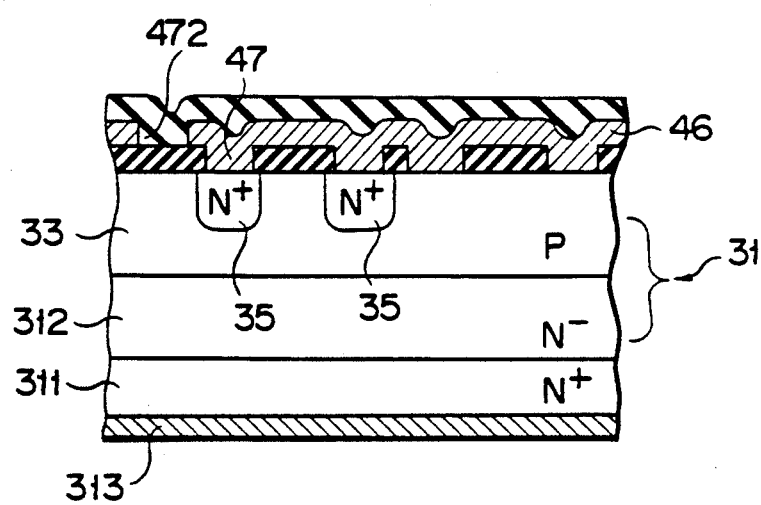
F I G. 12C
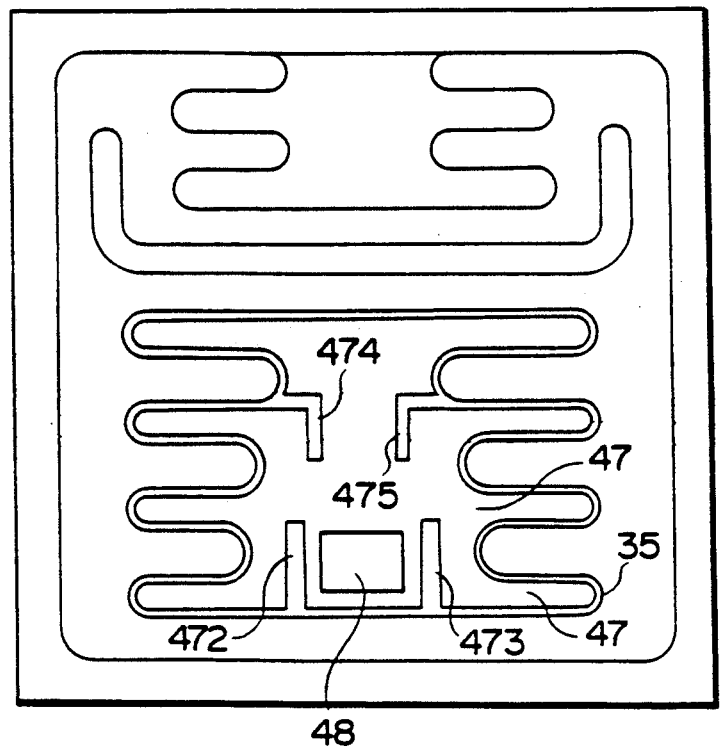
F I G. 13

SEMICONDUCTOR DEVICE CONSTITUTING BIPOLAR TRANSISTOR

This is a continuation of Application No. 07/114,287, filed Oct. 29, 1987, which was abandoned upon the filing hereof.

BACKGROUND OF THE INVENTION

This invention relates to a semiconductor device constituting a bipolar transistor and, more particularly, to a bipolar transistor, in which a connector portion for connecting an emitter surface electrode section, formed in correspondence to an emitter region, to an external circuit is formed on the emitter surface electrode for the purpose of electric connection.

A semiconductor device constituting a bipolar transistor has two Darlington-connected transistor elements. FIGS. 14A and 14B show a prior art semiconductor device with two Darlington-connected transistors. The device comprises semiconductor substrate 11 which consists of N+ type low resistivity collector layer 111 and N− type high resistivity collector layer 112. Semiconductor substrate 11 constitutes collector regions of two, i.e., first and second stage, transistors in Darlington connection. Collector electrode 12 is formed on the back side of semiconductor substrate 11.

In high resistivity collector layer 112 of the substrate, base regions 13 and 14 of the respective first and second stage transistors are formed by P type impurity diffusion. In base regions 13 and 14, respective emitter regions 15 and 16 are formed by N+ type impurity diffusion.

Emitter region 16 has an interdigital structure to provide an increased edge length so as to improve such characteristics as current capacity and current amplification factor. The interdigital structure is realized by forming a plurality of finger portions 160 to 169. Emitter region 15 likewise has an interdigital structure.

Surface electrode 17 is formed in correspondence to the base region of the first stage transistor. Surface electrode 18 is formed on correspondence to emitter region 15 of the first stage transistor and base region 14 of the second stage transistor. Surface electrode 19 is formed on emitter region 16 of the second stage transistor. Electrode 20 is formed on a central portion of surface electrode 17 for connecting the base to an external circuit. Likewise, electrode 21 is formed on a central portion of emitter surface electrode 19 of the second stage transistor for connecting the emitter to the external circuit. Lead lines are connected, by soldering for instance, to the surfaces of electrodes 20 and 21.

With the transistor circuit having the above structure, by applying a positive bias voltage to base surface electrode 17, a base current is caused to flow from base region 13 of the first stage transistor to emitter region 15 thereof to render the first transistor in the Darlington connection operative. When the first stage transistor is rendered operative, a collector current corresponding to the magnitude of the current amplification factor of the transistor is caused to flow from low resistivity collector layer 111 to high resistivity collector layer 112 and thence to emitter region 15 of the first stage transistor, whereby an amplifying operation is performed.

When a large current is caused to flow through emitter region 16 of the second stage transistor of the semiconductor device having the above structure, the resistance of surface electrode 19 with respect to the emitter region can no longer be ignored. More specifically, due to a voltage drop caused by the resistance noted above, the potential across emitter region 16 is increased. Therefore, the bias voltage between base and emitter regions 14 and 16 becomes lower with the distance from emitter connection electrode 21.

In a portion enclosed by dashed line A in FIG. 14A, currents Ia and Ib flowing from the side of finger portions 161 and 166, and currents Ic and Id flowing from the side of finger portions 160 and 165, which are more remote from emitter connection electrode 21 than finger portions 161 and 166, are combined. The currents noted above, therefore, include portions which pass through the same path. For this reason, in finger portions 160 and 165 voltage drops due to currents Ia and Ib are added to voltage drops due to currents Ic and Ic from these portions. This means a further increase of the potential on emitter region 16 of the second stage transistor, and hence a further reduction of the bias voltage. Therefore, the transistor operation is restricted in areas spaced apart from emitter connection electrode 21, that is, it takes place only in the neighborhood of emitter connection electrode 21. This localization of the transistor operation results in a reduction of the current capacity and current amplification factor of the transistor.

While a bipolar transistor having the Darlington connection structure has been shown as prior art, the same problem is encountered in the case of a single transistor structure. For transistor structures for high power purposes, therefore, particular considerations have to be given to the current capacity reduction due to the localization of the transistor operation.

SUMMARY OF THE INVENTION

An object of the invention is to provide a semiconductor device constituting a bipolar transistor which can effectively reduce localication of the transistor operation in the neighborhood of the emitter connection electrode even in case when a large current flows, thus improving transistor characteristics such as current capacity and the current amplification factor.

Another object of the invention is to provide a semiconductor device constituting a bipolar transistor which has an interdigital emitter structure such that the distances of current paths from individual finger portions to the emitter connection electrode are substantially equal.

A further object of the invention is to provide a semiconductor device constituting a bipolar transistor which can improve the reliability of the emitter connection electrode section by suppressing the temperature rise in this section.

In the semiconductor device constituting a bipolar transistor according to the invention, a base region is formed in correspondence to a principal surface of semiconductor substrate constituting a collector layer, an emitter region is formed in the base region, and a surface electrode is formed on the emitter region. An emitter connection electrode is formed at a particular position such that it is connected to the emitter surface electrode. The distances of current paths from different portions of the emitter surface electrode are made substantially equal by forming notches therein.

Therefore, even with the emitter formed such that it has an interdigital structure to improve transistor characteristics such as the current capacity and current amplification factor, the distances from the individual finger portions of the emitter surface electrode to the emitter connection electrode are made substantially equal. Localization of transistor characteristics thus can be improved to obtain effective improvement of transistor characteristics such as the current capacity and current amplification factor, and the semiconductor device can be effectively used for high power purposes.

BRIEF DESCRIPTION OF THE DRAWINGS

FIG. 2 is a view showing an equivalent circuit of the semiconductor device;

FIG. 3 is a fragmentary plan view, in an enlarged scale, showing the semiconductor device shown in FIG. 1A, particularly in the neighborhood of an emitter connection electrode;

FIG. 4 is a graph for explaining the current distribution in the emitter surface electrode of the semiconductor device;

FIG. 5 is a graph showing the relation between the collector current and current amplification factor;

FIG. 6A is a plan view showing a second embodiment of the semiconductor device according to the invention;

FIG. 6B is a sectional view taken along line b—b in FIG. 6A;

FIG. 12C is a fragmentary sectional view taken along line c—c in FIG. 12B;

FIG. 13 is a schematic plan view showing a fifth embodiment of the semiconductor device according to the invention;

DETAILED DESCRIPTION OF THE PREFERRED EMBODIMENTS

Figure 1A:
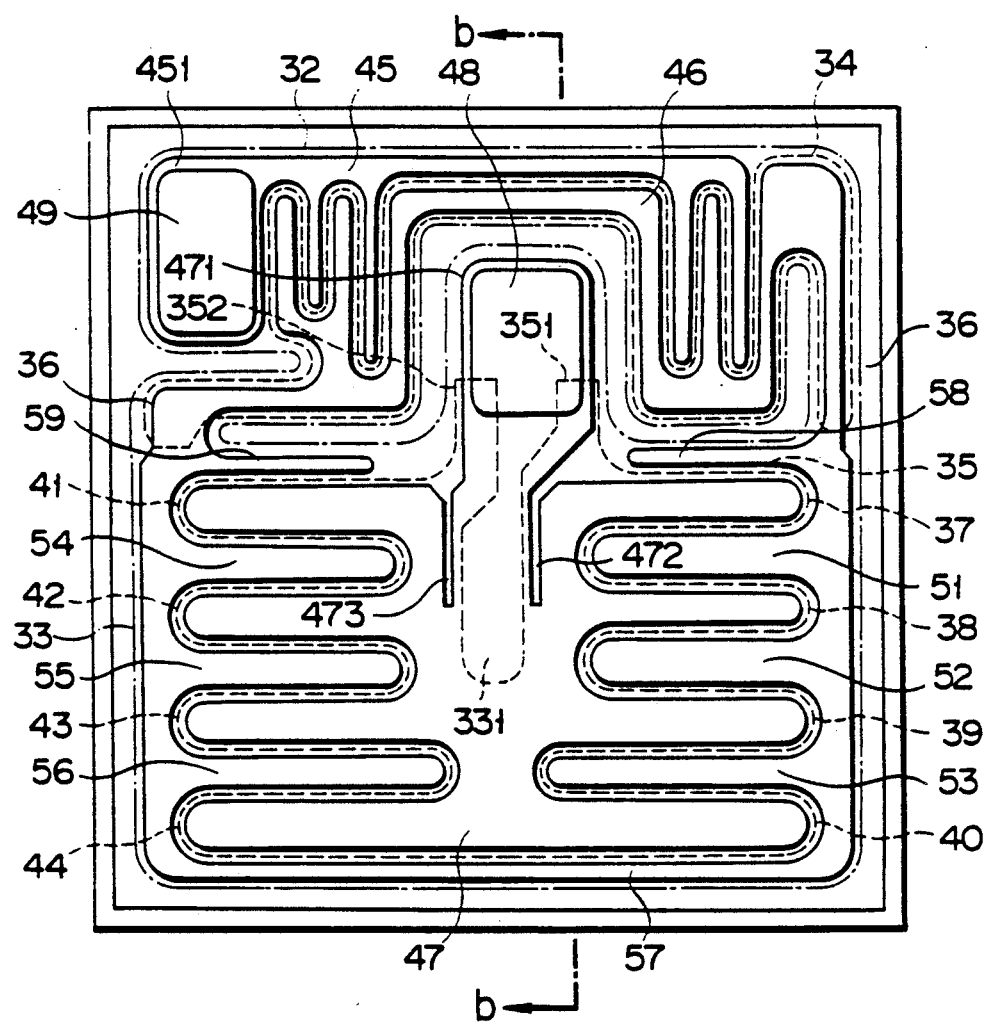
FIG. 1A is a plan view showing an embodiment of the semiconductor device according to the invention.
Figure 1B:
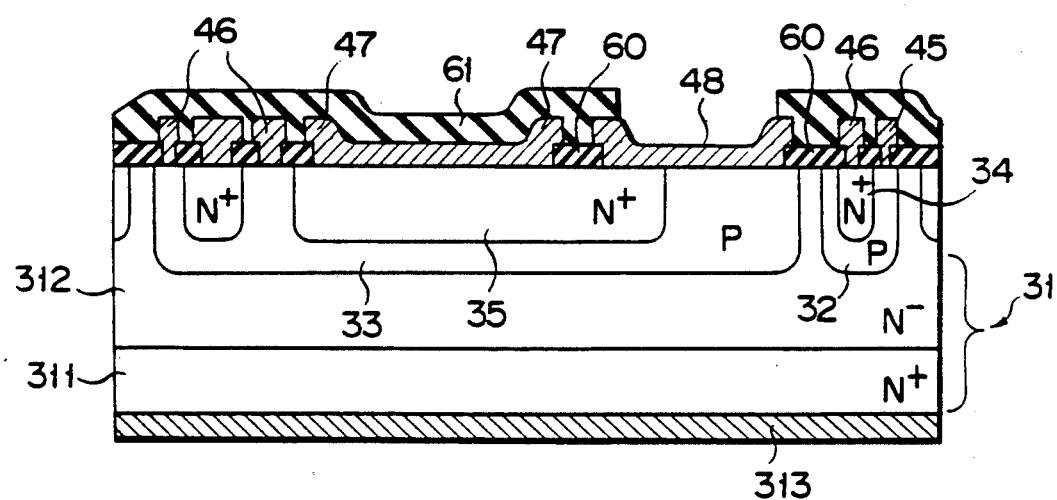
FIG. 1B is a sectional view taken along line b—b in FIG. 1B.

Figs. 1A and 1B show an embodiment of the semiconductor device. The device is a bipolar transistor having two Darlington-connected transistors. The two, i.e., first and second stage, transistors in Darlington connection are formed on semiconductor substrate 31. Semiconductor substrate 31 consists of N+ type low resistivity collector layer 311 with an N type impurity concentration of $1 \times 10^{20}$ atoms/cm$^3$ or above, and N$^-$ type high resistivity collector layer 312 with an N type impurity concentration of approximately $1 \times 10^{14}$ atoms/cm$^3$. Base regions 32 and 33 of the respective first and second stage transistors in Darlington connection are formed in high resistivity collector layer 312 of semiconductor substrate 31. In base regions 32 and 33, the P type impurity concentration is set to be approximately $1 \times 10^{16}$ to $1 \times 10^{17}$ atoms/cm$^3$. In base regions 32 and 33, N+ type emitter regions 34 and 35 of the first and second transistors are formed respectively with their N type impurity concentration set to $1 \times 10^{20}$ atoms/cm$^3$. Collector electrode 313 is formed on the back side of semiconductor substrate 31.

As shown in FIG. 1A, base regions 32 and 33 of the first and second stage transistors are electrically connected to each other by connection paths 36. Although not shown in detail, a resistive layer is formed on connection paths 36, so that resistor R1 is serially inserted between base regions 32 and 33.

Emitter region 35 of the second stage transistor has an interdigital structure. It has a plurality of finger portions 37 to 40 having a finger-like shape from a plan view and directed in one direction. It also has other finger portions 41 to 44 which are directed in the opposite direction. The distance between adjacent finger portions is set to be approximately 120 μm. Emitter region 34 of the first stage transistor also has an interdigital structure.

Base surface electrode 45 is formed on base region 32 of the first stage transistor. Surface electrode 46 is formed on the surface of first stage transistor emitter region 34 and second stage transistor base region 33. Emitter surface electrode 47 of second stage transistor is formed on to the second stage transistor emitter region 35. In a central portion of emitter region 35 between finger portions 37 to 40, on one hand, and finger portions 41 to 44, on the other, an aperture is formed to expose portion 331 of base region 33. In this aperture, base region 33 and surface electrode 47 are electrically connected to each other. Although not shown in detail, base region 33 and surface electrode 47 are coupled to each other via the resistance of resistor R2.

Emitter surface electrode 47 is formed such that it corresponds to emitter region 35 inclusive of the finger portions. It also has perpendicular portion 471 which extends in a direction perpendicular to the direction in which finger portions 37 to 44 extend. Emitter connection electrode 48 is formed on perpendicular portion 471 of emitter surface electrode 47 which is located outside an emitter operation zone occupied by finger portions 37 to 44.

Emitter region 35 of the second stage transistor has perpendicular portions 351 and 352 respectively extending from the stems of finger portions 37 and 41 toward emitter connection electrode 48. Exposed base region portion 331 is formed between perpendicular portions 351 and 352. In perpendicular portions 351 and 352 of the emitter region, substantially no transistor operation is provided.

Emitter surface electrode 47 of the first stage transistor has slits 472 and 473 extending from the stem of perpendicular portion 471 and crossing a line connecting finger portions 37 and 41. The emitter current flows along or bypasses slits 472 and 473.

Slits 472 and 473 are formed in emitter surface electrode 47 as follows. An oxide film is first formed on a portion of semiconductor substrate 31 where there is a PN junction formed by impurity diffusion. Then, a thin film of a conductor, e.g., aluminum, constituting the emitter surface electrode is formed over the entire semiconductor substrate inclusive of the oxide film. Thereafter, a predetermined portion of the conductor thin film including a portion over the oxide film is removed, whereby slits 472 and 473 are formed. Emitter connection electrode 48 is formed as a metalized layer on perpendicular portion 471 of emitter surface electrode 47. Portion 471 thus is made to be a lead connection terminal, to which a lead is connected by means of soldering.

In the first stage transistor, emitter region 34 has an interdigital structure with a plurality of finger portions with one end of each finger extending up to connection paths 36.

Base surface electrode 45 which is formed on base region 32 of the first stage transistor, has finger portions occupying spaces between adjacent ones of finger portions 37 to 44 of first stage transistor emitter region 35. Lead-out region 451 is formed on one corner of semiconductor substrate 11, and base connection electrode 49 is formed on lead-out region 451. Although not shown, a base lead is connected by means of soldering to base connection electrode 49.

The arrangement of emitter surface electrode 47, which is formed on predetermined areas of first stage transistor emitter region 34 and second stage transistor base region 33, will be further described. Surface electrode 47 is formed on the inner side of first stage transistor emitter region 34. In second stage transistor base region 33, finger-like base electrode portions 51 to 56 are formed such that they occupy spaces between adjacent ones of finger portions 37 to 44 of second stage transistor emitter region 35. Connecting portion 57 electrically connecting finger-like base electrode portions 53 and 56 is also formed. Finger-like base electrode portions 58 and 59 are further formed extending along respective finger portions 37 and 41 of emitter toward emitter connection terminal 48.

FIG. 2 shows an equivalent circuit of the semiconductor device having the above construction. As is shown, first and second stage transistors Tr1 and Tr2 are Darlington connected. In this equivalent circuit, parts like those in the semiconductor device shown in Figs. 1A and 1B are designated by like reference numerals.

FIG. 3 shows emitter connection electrode 48 and the neighborhood thereof in an enlarged scale. End 591 of finger-like base electrode portion 59 is spaced apart by distance 1 from perpendicular portion 352 of emitter region 35.

Oxide film 60 is formed on the principal surface of semiconductor substrate 31 to protect PN junctions formed in the principal surface. Further, surface protective film 61 is formed on various electrodes.

Figure 14A:
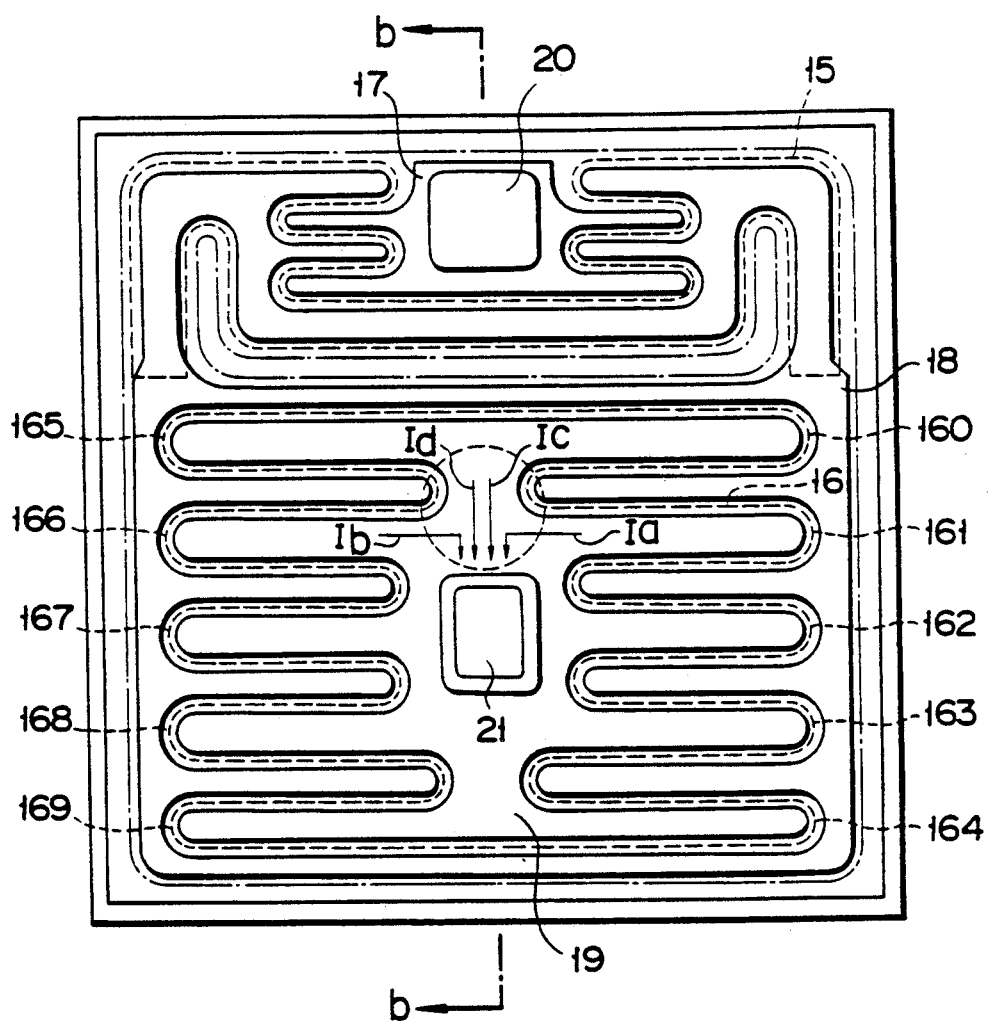
FIG. 14A is a plan view showing a prior art semiconductor device.
Figure 14B:
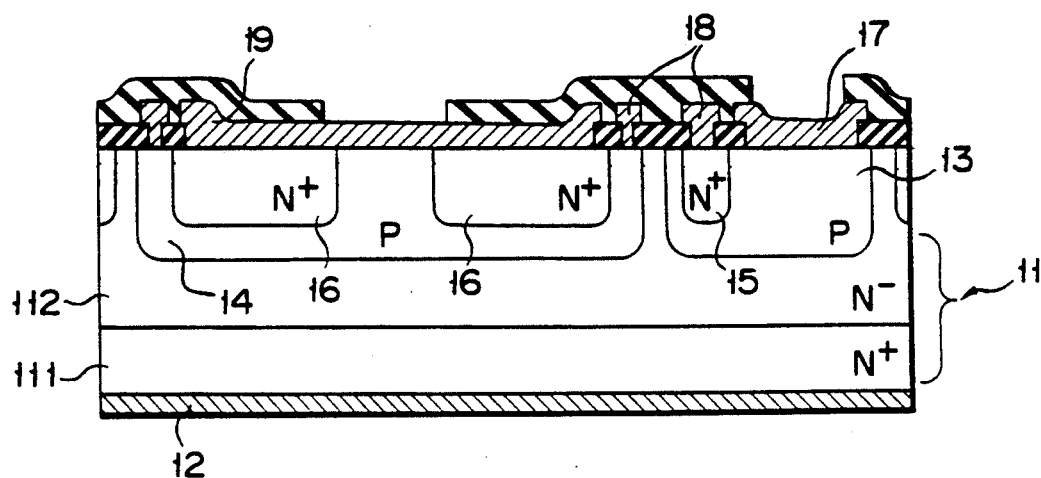
FIG. 14B is a sectional view taken along line b—b in FIG. 14A.

The semiconductor device having the above construction operates in the same way as the prior art semiconductor device shown in FIG. 14. In the above semiconductor device, however, emitter connection electrode 48 is provided not in the area surrounded by second stage transistor emitter region 35, in which heat readily builds up, but on perpendicular portion 471 projecting from this area. Therefore, even when a large current is caused to flow in second stage transistor emitter region 35 to cause generation of heat in the collector region right beneath the emitter region so as to elevate the temperature thereof, the influence of heat is reduced in the area near emitter connection electrode 48. Thus, it is possible to effectively reduce the thermal fatigue the connection portion of the lead connected to emitter connection electrode 48.

However, with emitter connection electrode 48 provided at a position spaced apart from the operative zone of emitter region 35, the distances of individual points in emitter region 35 from emitter connection electrode 48 differ greatly. For example, finger portions 37, 38, 41 and 42 are spaced apart by smaller distances from emitter connection electrode 48 than finger portions 39, 40, 43 and 44. For this reason, when the current flowing in second stage transistor emitter region 35 is increased, the current paths from individual portions of emitter surface electrode 47 to emitter connection electrode 48 offer different resistances. In correspondence to these differences, localization is produced in the transistor operation to deteriorate transistor characteristics such as the current capacity and current amplification factor. In the embodiment of the semiconductor device described above, however, 472 and 473 are formed in second stage transistor emitter surface electrode 47. Therefore, current I flowing through finger portions 37 and 41 bypasses slits 472 and 473, as shown in FIG. 3, that is, the length of the current path is increased. More particularly, the resistance of the lead, through which current I flows, is increased in correspondence to the increase the current path length.

For example, it is possible to make the distances of finger portions 39, 40, 43 and 44 from emitter connection electrode 48 substantially equal, and as a whole the lead resistance is uniform from individual points of emitter surface electrode 47 to emitter connection electrode 48. For this reason, the potential distribution of emitter region 35 of the second stage transistor is made uniform, and the polarization of the transistor operation is sufficiently alleviated.

FIGS. 4 and 5 show results of experiments conducted by the inventor. In FIG. 4, the abscissa is taken for the distance of each point of emitter region 35 from emitter connection electrode 48, and the ordinate is taken for emitter current Ie at each point. The overall emitter current $I_E$ is 8 A, and collector-emitter voltage V, as detected, is approximately 3 V.

In FIG. 4, curve A is obtained in the case where slits 472 and 473 are not provided, emitter current $I_E$ being reduced with an increase of the distance from emitter connection electrode 48. With slits 472 and 473 provided as in this embodiment, emitter current $I_E$ is uniform, as is represented by curve B.

FIG. 5 shows current amplification factor $h_{fe}$ plotted against collector current $I_C$ in case when a voltage of 5 V is applied between the collector and base electrodes. The solid curve is obtained where slits 402 and 403 are provided as in the embodiment, while the dashed curve corresponds to the case where slits 472 and 473 are not provided. More specifically, with the construction of the embodiment with an increase of collector current $I_C$, the difference in the current amplification factor is increased compared to the case where there are no slits. More specifically, since the lead resistance is uniforme from each point of emitter surface electrode 47 to emitter connection electrode 48, the localization of transistor operation is alleviated in case when the collector current is increased.

In the semiconductor device of the embodiment, end 591 of finger-like base electrode portion 59 is spaced apart by distance 1 from perpendicular portion 352 of emitter region 35, as shown in an enlarged scale in FIG. 3. A portion of current that is injected from surface electrode 46 into base region 33 of the second stage transistor flows through that portion of base region 33 which extends between end 591 and portion 352, to the neighborhood of emitter connection electrode 48. The amount of current becomes smaller as distance l becomes larger. By setting the distance l to be sufficiently large, it becomes possible to suppress the transistor operation in the neighborhood of emitter connection electrode 48 where the transistor operation is liable to be localized.

In this embodiment, finger-like base electrode portions 58 and 59 are arranged symmetrically, and end 581 of finger-like base electrode portion 58 is comparatively close to perpendicular portion 351 of emitter region 35. However, for the purpose of suppressing the transistor operation in the neighborhood of emitter connection electrode 48, it is possible to have end 518 spaced apart by a greater distance from perpendicular portion 481, specifically, by reducing the length of fingerlike base electrode portion 58.

FIGS. 6A and 6B show a second embodiment of the invention. Like the first embodiment, semiconductor substrate 31 consists of low resistivity collector layer 311 and high resistivity collector layer 312. Base regions 32 and 33 of respective first and second stage transistors are formed in substrate 31. Emitter regions 34 and 35 of the first and second stage transistors are formed in respective base regions 32 and 33. Emitter region 35 of the second stage transistor has a plurality of finger portions 37a to 37g and 41a to 41g in a symmetrical arrangement. Surface electrode 45 of the first stage transistor is formed on the first stage transistor base region. Surface electrode 46 is formed on predetermined surface areas of first stage transistor emitter region 34 and second stage transistor base region 33. Emitter surface electrode 47 is formed on the surface of second stage transistor emitter region 35. Emitter connection electrode 48 is formed on a central portion of emitter region 35. Base connection electrode 49 is formed on base region 32.

In this embodiment, emitter surface electrode 47 has slits 474 and 475. Slit 474 is formed in a portion between the space portion between finger portions 37c and 37e and emitter connection electrode 48, while slit 475 is formed in a portion between the space portion between finger portions 41c and 41e and electrode 48. Further, emitter surface electrode 47 has slits 476, 477, 478 and 479 respectively extending from ends of space portions corresponding to the stems of finger portions 37a, 41a, 37g and 41g toward emitter connection electrode 48.

In this embodiment, current $I_D$ flowing in finger portions 37d and 41d bypasses slits 474 and 475, as shown by arrows in FIG. 6A. Thus, the lead resistance from finger portions 37d and 41d to emitter connection electrode 48 is increased. The transistor operation in the neighborhood of these areas is thus suppressed, thus alleviating the phenomenon of localization of the transistor operation.

Figure 7:
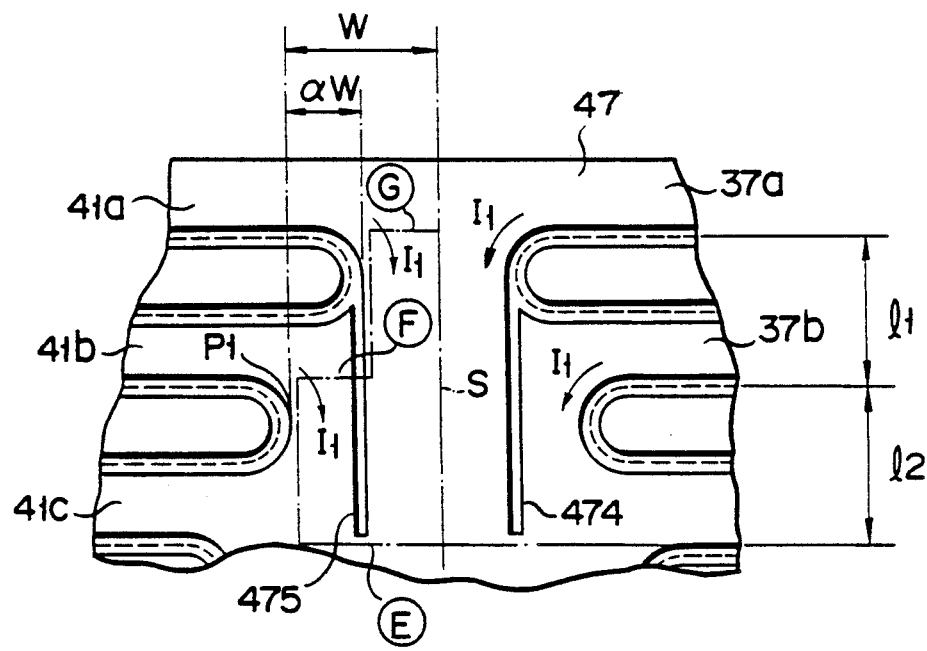
FIG. 7 is a fragmentary plan view, in an enlarged scale, showing an emitter surface electrode of the semiconductor device shown in FIG. 6A.

FIG. 7 shows, to an enlarged scale, emitter connection electrode 48 shown in FIG. 6A. If slits 476 and 477 are absent, the potential is determined by the lead resistance of emitter surface electrode 47 and current flowing therein. Assuming that the sheet resistance of second stage emitter surface electrode 47 is R and that current I1 is flowing from points F and G, since current from individual points are combined, potential $V_F$ at point F with reference to point E is given as $$V_F = 2I1 \cdot R(l2/W) \ldots \quad (1)$$

Potential $V_R$ at point G with reference to point E is the sum of potential $V_F$ noted above and a voltage drop produced when current I1 flows by distance l, and is given as $$V_R = 2I1 \cdot R(l2/W) + I1 \cdot R\{l1/(1-\alpha)W\} \ldots \quad (2)$$

From equations 1 and 2, the potential difference between points G and F is $$V_R - V_F = I1 \cdot R\{l1/(1-\alpha)W\} > 0 \ldots \quad (3)$$

Since this value can not be reduced to zero, a potential difference is produced at all time between points G and F. For this reason, the transistor operation is localized toward point F at all times.

In contrast, with slits 474 and 475 provided as in this embodiment, they restrict current path, and potential $V_F$ at point F with reference to point E, which is the voltage drop due to current I1 flowing from point F, is given as $$V_F1 = I1 \cdot R(l2/\alpha W) \ldots \quad (4)$$

Potential $V_R$ at point G with reference to point E is $$V_R1 = I1 \cdot R\{(l1+l2)/(1-\alpha)W\} \ldots \quad (5)$$

From equations 4 and 5, the potential difference between points G and F is given as $$V_R1 - V_F1 = I1 \cdot R \cdot [\{(l1+l2)/(1-\alpha)W\} - (l2/\alpha W)] \ldots \quad (6)$$

The value in equation 6 may be made zero by satisfying a condition $$\{(l1+l2)/(1-\alpha)W = l2/\alpha W \ldots (7)$$

If we set l1=l2, equation 7 is reduced to $$2l1/(1-\alpha)W = l1/\alpha W$$
$$\alpha = 1/3$$

It is to be understood that the potential difference between points G and F can be eliminated by setting the distance from point P1 to end of the space portion between finger portions 41b and 41c and intermediate line S to be one-third of the distance from point P1 to slit 475. In this way, it is possible to obtain a uniform potential distribution over the entire area of second stage transistor emitter surface electrode 47, and the localization of the transistor operation can be sufficiently alleviated.

Figure 8A:
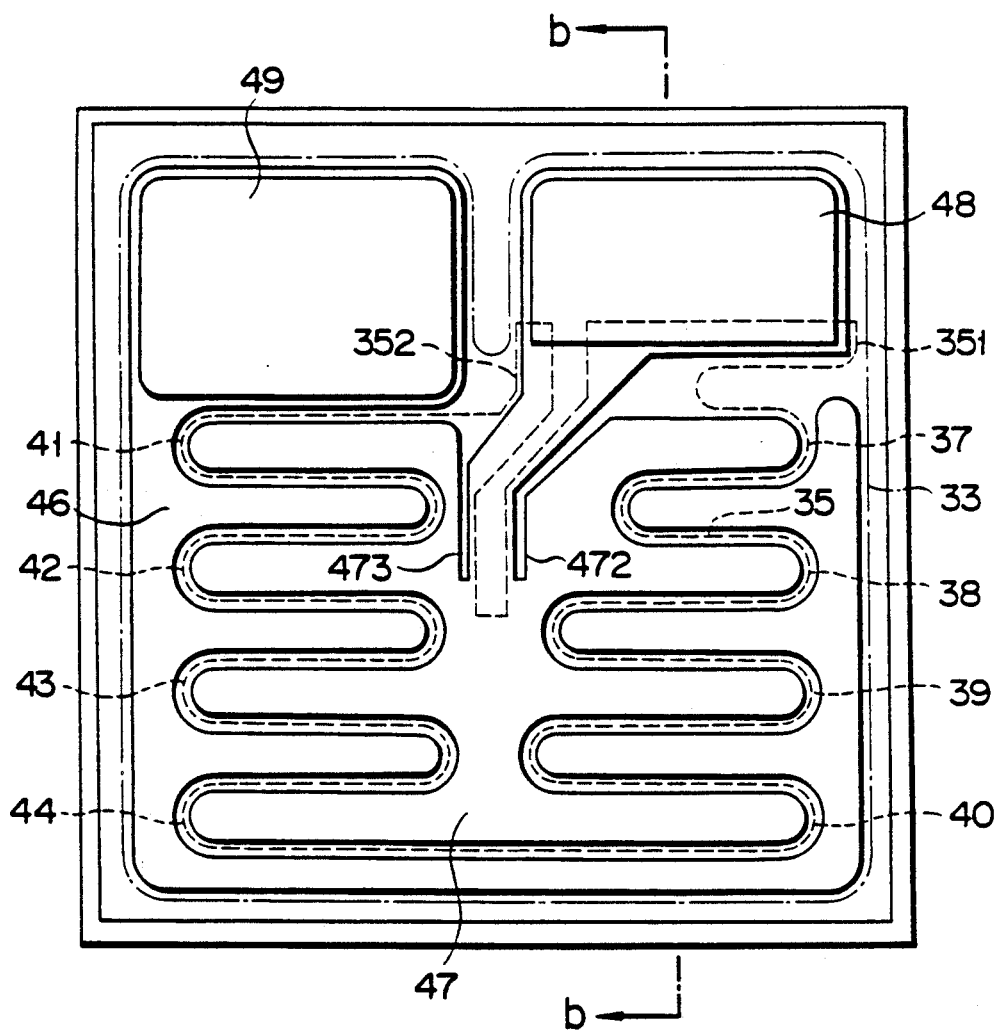
FIG. 8A is a plan view showing a third embodiment of the semiconductor device according to the invention.
Figure 8B:
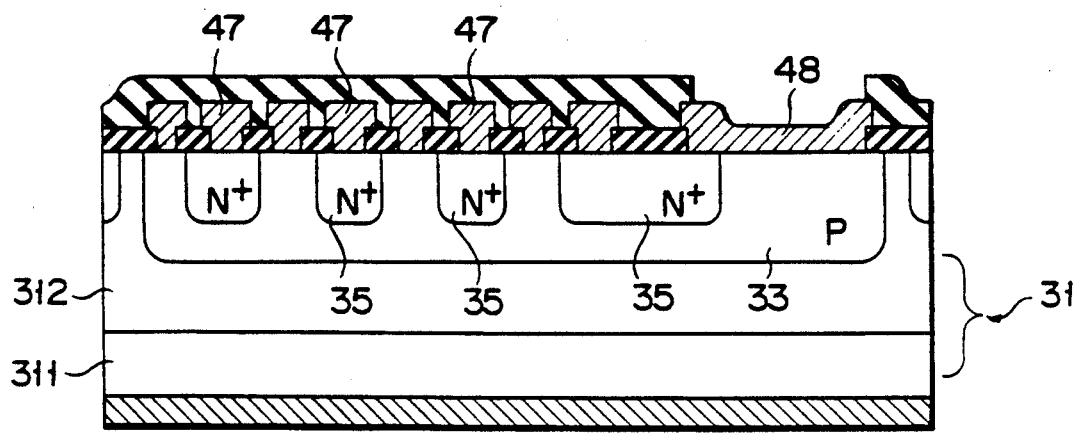
FIG. 8B is a sectional view taken along line b—b in FIG. 8A.

FIGS. 8A and 8B show a third embodiment of the invention. This embodiment constitutes a single bipolar transistor, which is constructed in the same manner as the second stage transistor in the embodiment shown in FIG. 1. In FIGS. 8A and 8B parts like those in FIGS. 1A and 1B are designated by like reference numerals and are not described any further.

Figure 9:
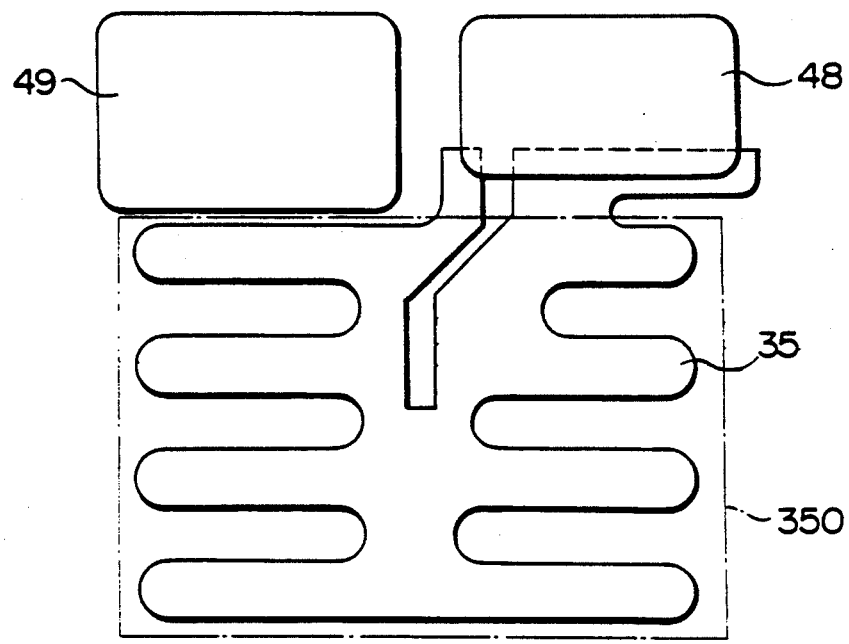
FIG. 9 is a plan view showing an emitter region of the embodiment of FIG. 6A.

In this embodiment, emitter and base connection electrodes 48 and 49 are formed at positions outside transistor operation zone 350 of emitter region 35 shown in FIG. 9.

For example, where at least two sides of the emitter connection electrode section are in contact with the transistor operation zone, heat generated in the emitter region at the time of the transistor operation is efficiently transmitted to the emitter connection electrode section. Thus, excessive heat is transmitted to the solder portion connecting the lead to the lead connection terminal. In this case, it is difficult to ensure sufficient reliability of the connection portion.

Figure 10A:
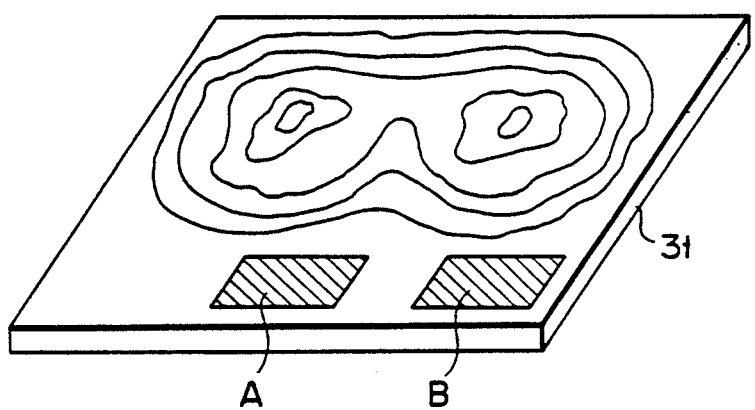
FIGS. 10A and 10B are perspective views for explaining heat distribution in semiconductor devices.

FIG. 10A shows the state of heat distribution in a case where base and emitter connection electrodes A and B are formed collectively along one side of the surface of semiconductor substrate as in the above embodiment. With connection electrodes A and B provided at positions outside the emitter region such that they have only one side facing the emitter region, the temperature rise of connection electrodes A and B can be sufficiently suppressed. In contrast, where either one of two connection electrodes a and b, e.g., electrode b, is provided in the transistor operation zone as shown in FIG. 10B, that is, in the case of the arrangement as shown in FIG. 14A, connection electrode b is formed in the zone of heat generation due to the transistor operation, so that the temperature of electrode b is extremely elevated.

Figure 10B:
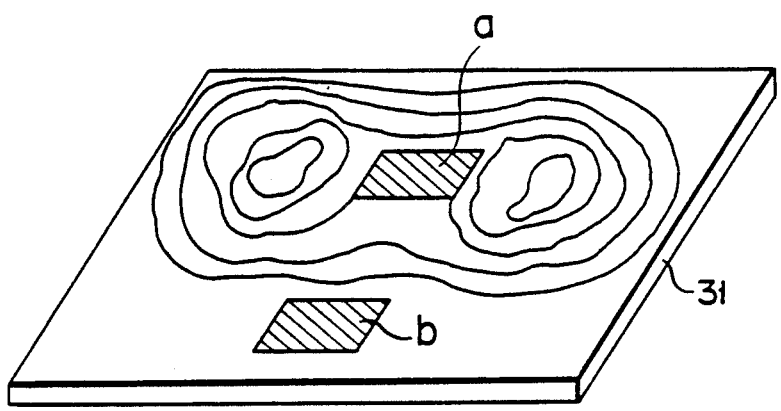
Figure 11:
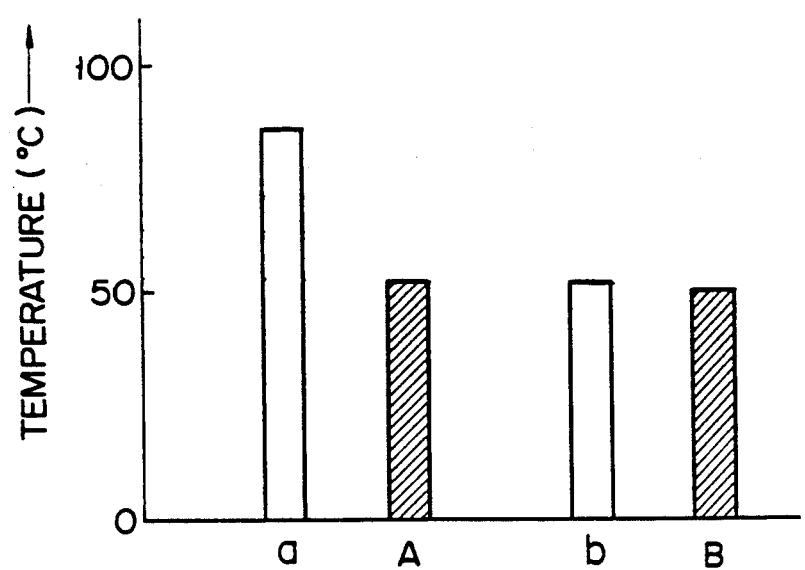
FIG. 11 is a graph showing temperatures in various parts of the semiconductor devices shown in FIGS. 10A and 10B.

FIG. 10A shows the example shown in FIG. 8A, and FIG. 10B shows the example shown in FIG. 14A. FIG. 11 shows temperatures produced under the conditions that the second stage transistor emitter current is $I_E$, collector-emitter voltage is 10 V, and the on-off cycle frequency is 20 Hz. In FIG. 11, A, B, a and b respectively show the temperatures of electrodes A, B, a and b shown in FIGS. 10A and 10B. It is confirmed that temperature A of emitter connection electrode 48 is approximately 30° C. lower than the case of the example of FIG. 14A.

Figure 12A:
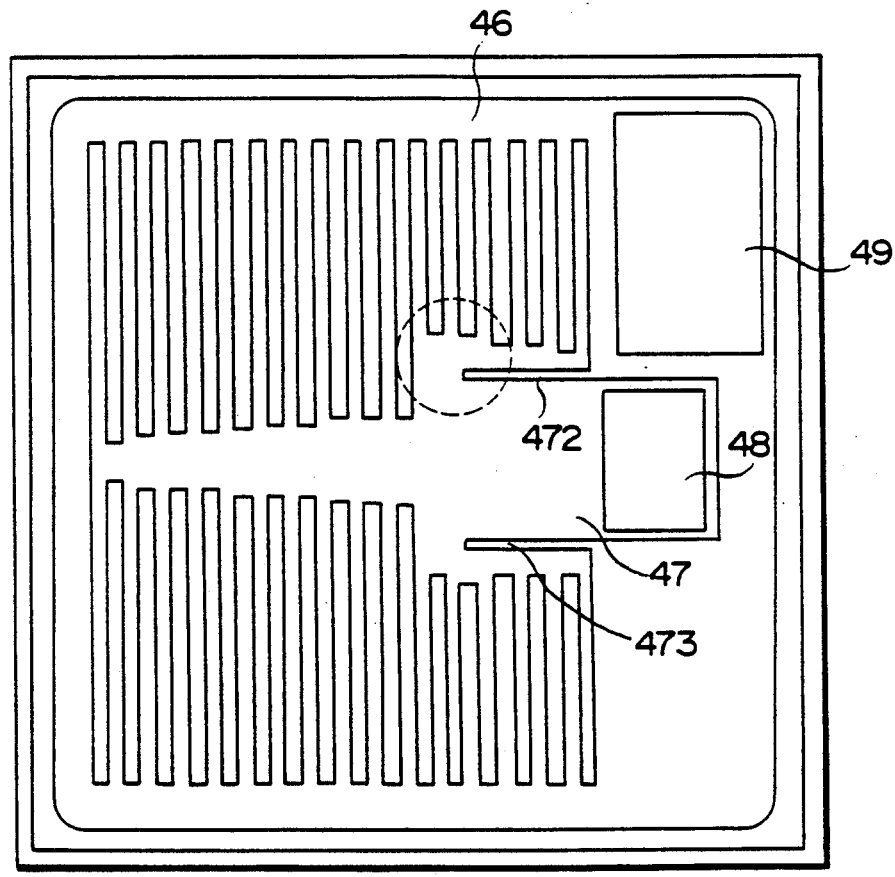
FIG. 12A is a plan view showing a fourth embodiment of the semiconductor device according to the invention.
Figure 12B:
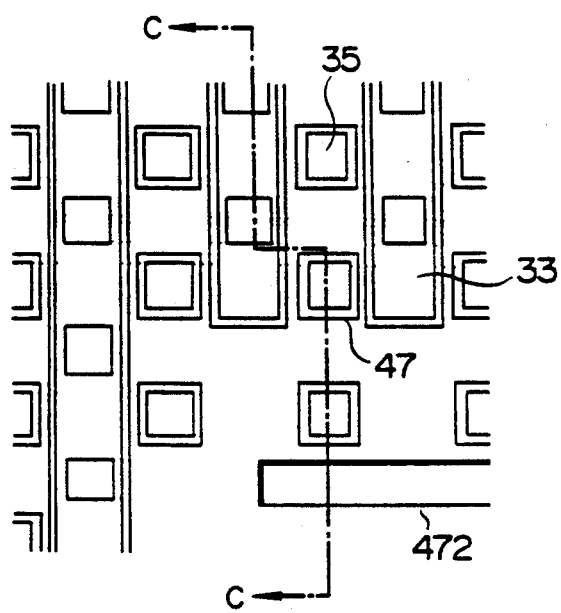
FIG. 12B is a fragmentary plan view, in an enlarged scale, showing a portion enclosed in a dashed circle in FIG. 12A.

FIGS. 12A to 12C show a fourth embodiment. This example is a multi-emitter type bipolar transistor. Like the preceding embodiments, semiconductor substrate 31 consists of low resistivity collector layer 311 and high resistivity collector layer 312, and emitter region 35 is formed in base region 33 formed in substrate 31. Actually, a plurality of regions are formed as emitter region 35 in base region 33. Each emitter region 35 constitutes a transistor unit together with base region 33, high resistivity collector layer 312 and low resistivity collector layer 311. Slits 472 and 473 are formed in the emitter surface electrode which is formed over the entire surface of the device such that the lead resistance with respect to emitter connection electrode is uniform.

The above embodiments of the invention are by no means limitative. For example, while the above embodiments concern PNP bipolar transistors, the invention is applicable to NPN types as well. Further, it is possible to connect two or more bipolar transistors.

FIG. 13 schematically shows a fifth embodiment of the invention. In this embodiment, emitter connection electrode 48 is provided on an end portion of emitter region 35. Slits 472 and 473 formed in emitter surface electrode 47 are formed such that they extend in a direction perpendicular to the finger portions of emitter connection electrode. Further, slits 474 and 475 are formed such that they extend from the stem of finger portions. Slits 474 and 475 may have bent end portions extending toward emitter connection electrode 48. Of course, the slits formed in emitter surface electrode 47 may have bent or curved configurations.

What is claimed is:

1. A semiconductor device constituting a bipolar transistor, comprising:

a semiconductor substrate including a collector region, a collector electrode being formed in correspondence to said collector region;

a base region formed in correspondence to a principal surface of said semiconductor substrate;

an emitter region formed in said base region;

an emitter surface electrode formed on said semiconductor substrate in correspondence to said emitter region;

an emitter connection electrode formed on said semiconductor substrate and connected to said emitter surface electrode; and current bypassing means constituted by slits formed in said emitter surface electrode at a location between said emitter region close to said emitter connection electrode and said emitter connection electrode for elongating a current path between said emitter region close to said emitter connection electrode and said emitter connection electrode, the current path following a path to bypass said slits, so as to provide for a uniform potential distribution over said emitter region.

2. The semiconductor device according to claim 1, wherein said emitter region has an interdigital shape having a plurality of finger portions in a symmetrical arrangement, said emitter connection electrode being formed between opposite side portions of the symmetrical arrangement of said finger portions and on a line perpendicular to a direction of extension of said finger portions, said current bypassing means being constituted by a pair of slits formed in said emitter connection electrode between the symmetrical finger portions of the emitter region on the opposite sides of said emitter connection electrode such that they extend in a direction perpendicular to the direction of extension of said finger portions.

3. The semiconductor device according to claim 2, wherein said emitter connection electrode is provided at a position outside a transistor operation zone defined by said plurality of finger portions, said emitter region and emitter surface electrode being formed such that they extend up to said emitter connection electrode, said pair of slits being formed such that they extend from a position close to stem portions of finger portions closest to said emitter connection electrode in a direction perpendicular to the direction of extension of said finger portions.

4. The semiconductor device according to claim 2, wherein said emitter connection electrode is formed on a central portion of the emitter region with a plurality of finger portions in a symmetrical arrangement, said slits being formed along the opposite sides of said emitter connection electrodes facing space portions between adjacent finger portions.

5. The semiconductor device according to claim 2, wherein said finger portions of said emitter region extend in parallel to one another in symmetrical directions, said emitter connection electrode being formed on a central portion of the emitter region that has the plurality of finger portions in a symmetrical arrangement, said slits being formed along opposite sides of said emitter connection electrode facing space portions between adjacent finger portions, said slits being formed so that they extend toward the emitter connection electrode from a stem portion situated between a finger portion most remote from said emitter connection electrode and a finger portion second-most remote from the emitter connection electrode.

6. The semiconductor device according to claim 1, wherein a plurality of emitter regions are formed in the form of a matrix in a base region formed in said semiconductor substrate to form a multi-emitter type bipolar transistor, an emitter surface electrode is formed to be common to said plurality of emitter regions, an emitter connection electrode is formed substantially on a central portion of an area where said plurality of emitter regions are formed, said slits constituting said current bypassing means being formed in said emitter surface electrode on the opposite sides of said emitter connection electrode, portions of said plurality of emitter regions close to said emitter connection electrode being formed on an outer side of said slits.

7. The semiconductor device according to claim 1, wherein said bipolar transistor is a Darlington transistor, and there are two of said base regions, said base regions being formed in said semiconductor substrate and corresponding respectively to first and second stage transistors in said Darlington connection, said emitter regions of said first and second stage transistors being formed in said respective base regions, and said emitter surface electrode is formed on the emitter region of said second stage transistor and provided with said current bypassing means constituted by the slits formed in said emitter surface electrode.

8. The semiconductor device constituting a bipolar transistor, comprising:
- a semiconductor substrate, a collector region being formed in said substrate, a collector electrode being formed in correspondence to said collector region;
- a base region formed in correspondence to a principal surface of said semiconductor substrate;
- an emitter region formed in said base region having a plurality of finger portions in a symmetrical arrangement with space portions between the finger portions;
- an emitter surface electrode formed on said semiconductor substrate in correspondence to said emitter region;
- an emitter connection electrode formed on said semiconductor substrate between opposite side portions of said symmetrical arrangement of said finger portions and connected to said emitter surface electrode;
- current bypassing means constituted by slits formed in said emitter surface electrode which extend along one side of said emitter connection electrode and close to space portions between adjacent finger portions on the opposite sides of said emitter connection electrode, for lengthening a current path between emitter region finger portions close to said emitter connection electrode and said emitter connection electrode, which current path bypasses said slits; and
- current path setting means, constituted by slits formed so that they extend toward the emitter connection electrode from a stem portion situated between a finger portion of said emitter region most remote from said emitter connection electrode and from a finger portion second-most remote from said emitter connection electrode.

9. The semiconductor device according to claim 8, wherein said current path setting means is constituted by slits formed in said emitter surface electrode such that current paths independently extend from stem portions of finger portions of the emitter region farthest from said emitter connection electrode in opposite directions toward said emitter connection electrode.

10. The semiconductor device according to claim 3, wherein said slits constituting the current bypassing means separate the emitter connection electrode from said stem portions of finger portions closest to the emitter connection electrode.

11. The semiconductor device according to claim 5, wherein said slits are formed between said emitter connection electrode and a pair of finger portions adjacent to either side of the emitter connection electrode, respectively.

12. The semiconductor device according to claim 8, wherein said finger portions arranged symmetrically on both sides of the emitter connection electrode are parallel to one another.

13. A semiconductor device as in claim 1, wherein said emitter region defines a transistor operation zone, and said emitter connection electrode is formed outside said transistor operation zone.

14. A semiconductor device as in claim 8, wherein said emitter region defines a transistor operation zone, and said emitter connection electrode is formed outside said transistor operation zone.

* * * * *